(12) United States Patent
Mieno

(10) Patent No.: US 8,569,798 B1
(45) Date of Patent: Oct. 29, 2013

(54) SEMICONDCUTOR DEVICE COMPRISING TRANSISTOR

(71) Applicant: Semiconductor Manufacturing International Corp., Shanghai (CN)

(72) Inventor: Fumitake Mieno, Shanghai (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 13/923,883

(22) Filed: Jun. 21, 2013

Related U.S. Application Data (62) Division of application No. 13/204,319, filed on Aug. 5, 2011, now Pat. No. 8,492,213.

(30) Foreign Application Priority Data

Dec. 29, 2010 (CN) .......................... 2010 1 0613284

(51) Int. Cl.
*H01L 29/772* (2006.01)
*H01L 21/8238* (2006.01)

(52) U.S. Cl.
USPC ........... 257/192; 257/190; 257/330; 257/334; 257/369; 257/408; 257/E21.403; 257/E21.409; 257/E21.621; 257/E21.646; 438/168; 438/198; 438/288; 438/299

(58) Field of Classification Search
USPC ................. 257/190, 192, 330, 334, 369, 408; 257/E21.403, E21.409, E21.621, E21.646; 438/168, 198, 288, 299
See application file for complete search history.

(56) References Cited

U.S. PATENT DOCUMENTS

| 8,420,511 | B2 * | 4/2013 | Mieno ........................ 438/473 |
| 2010/0044752 | A1 * | 2/2010 | Marui ......................... 257/192 |
| 2011/0183480 | A1 * | 7/2011 | Chang ......................... 438/168 |
| 2011/0303951 | A1 * | 12/2011 | Zhu et al. .................... 257/192 |
| 2012/0280279 | A1 * | 11/2012 | Guo et al. .................... 257/192 |

FOREIGN PATENT DOCUMENTS

CN 101393894 A 3/2009

* cited by examiner

*Primary Examiner* — Dao H Nguyen
(74) *Attorney, Agent, or Firm* — Anova Law Group, PLLC

(57) ABSTRACT

The present invention provides a transistor and a method for forming the same. The method includes: providing a semiconductor substrate having a semiconductor layer formed thereon, the semiconductor layer and the semiconductor substrate having different crystal orientations; forming a dummy gate structure on the semiconductor layer; forming a source region and a drain region in the semiconductor substrate and the semiconductor layer and at opposite sides of the dummy gate structure; forming an interlayer dielectric layer on the semiconductor layer, which is substantially flush with the dummy gate structure; removing the dummy gate structure and the semiconductor layer beneath the dummy gate structure, forming an opening in the interlayer dielectric layer and the semiconductor layer, the semiconductor substrate being exposed at a bottom of the opening; forming a metal gate structure in the opening. Saturation current of the transistor is raised, and performance of a semiconductor device is promoted.

9 Claims, 6 Drawing Sheets

SEMICONDCUTOR DEVICE COMPRISING TRANSISTOR

CROSS REFERENCE TO RELATED APPLICATIONS

This application is a divisional of U.S. patent application Ser. No. 13/204,319, filed on Aug. 5, 2011, which claims priority to Chinese Patent Application No. 201010613284.3, filed on Dec. 29, 2010, all of which are incorporated herein by reference in their entirety.

BACKGROUND OF THE INVENTION

1. Field of the Invention

The present invention is related to the field of semiconductor technology, and particularly to a transistor and a method for forming the same.

2. Description of Prior Art

Stress Memorization Technique (SMT) and Stressed-contact etch stop layer (Stressed-CESL) are two solutions to promote transistor carrier mobility currently. By virtue of the two solutions, stable stress is formed in a channel region of a transistor which can promote carrier mobility in the channel. The stress is parallel to the longitudinal direction of the channel, and may be tensile stress or compressive stress. In general, the tensile stress may loosen the atomic arrangement in the channel for promoting mobility of electrons, and is adapted for NMOS transistor. The compressive stress may tighten the atomic arrangement in the channel for promoting mobility of holes, and is adapted for PMOS transistor.

Figure 1:
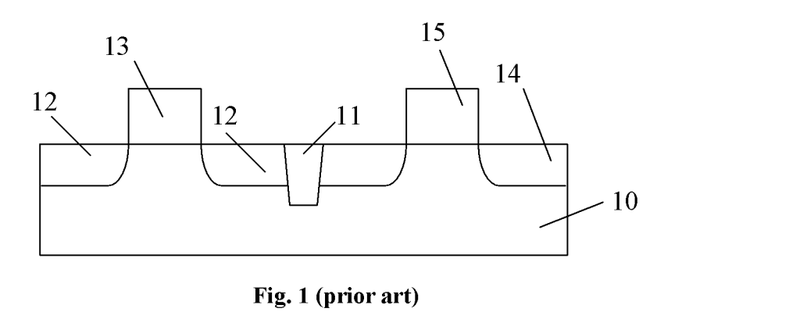
FIGS. 1-3 are cross-sectional views of intermediate structures of a transistor, illustrating a conventional method for forming the transistor.
Figure 2:
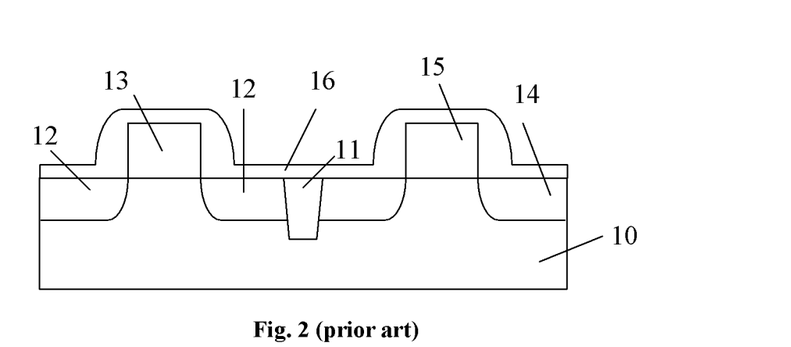
Figure 3:
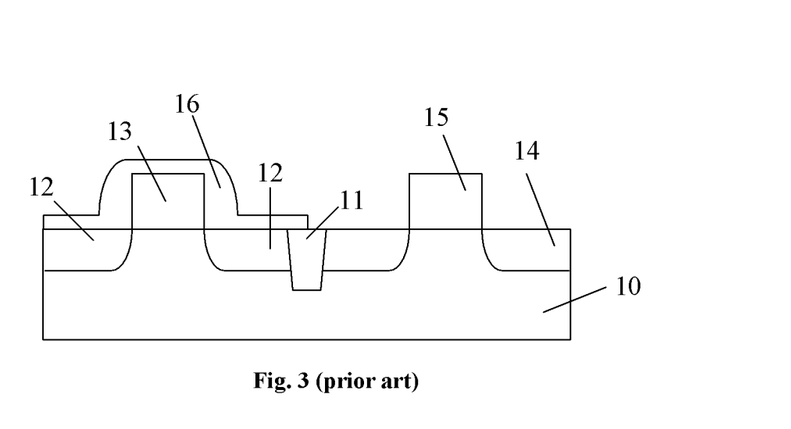

FIGS. 1-3 are cross-sectional views showing a method for forming a transistor in prior art.

First, referring to FIG. 1, a semiconductor substrate 10 is provided. An NMOS transistor and a PMOS transistor are formed in the semiconductor substrate 10. An isolation structure 11 is formed between the NMOS transistor and the PMOS transistor. The NMOS transistor comprises a P well (not shown), NMOS transistor source/drain regions 12 in the P well, and an NMOS transistor gate electrode 13 on the semiconductor substrate between the NMOS transistor source/drain regions 12. The PMOS transistor comprises an N well (not shown), PMOS transistor source/drain regions 14 in the N well, and a PMOS transistor gate electrode 15 on the semiconductor substrate between the PMOS transistor source/drain regions 14.

Then, referring to FIG. 2, a stress layer 16 is formed on the NMOS transistor and the PMOS transistor, covering the NMOS transistor source/drain regions 12, the NMOS transistor gate electrode 13, and the semiconductor substrate 10. The material of the stress layer 16 can be silicon nitride. The stress layer 16 can provide tensile stress or compressive stress. Supposing the stress layer 16 provides tensile stress and has a beneficial affect on the NMOS transistor.

Then, referring to FIG. 3, through etching process using a mask layer, the stress layer 16 on the PMOS transistor is removed, while the stress layer 16 on the NMOS transistor is remained. The stress layer 16 on the NMOS transistor is annealed for providing tensile stress which stays in the NMOS transistor. The tensile stress promotes carrier (electrons) mobility in the NMOS transistor channel. After annealing, the stress layer 16 on the NMOS transistor gate electrode 13, the NMOS transistor source/drain regions 12 and the semiconductor substrate 10 are removed by etching.

However, it is found in practice that saturation current of transistors formed by conventional methods is too low and device performance is affected.

SUMMARY OF THE INVENTION

A technical problem solved by the present invention is to provide a transistor and a method for forming the same. The method increases saturation current of the transistor and promotes device performance.

For solving the technical problem mentioned above, the present invention provides a method for forming a transistor, which comprises:

providing a semiconductor substrate, a semiconductor layer being formed thereon, the semiconductor layer and the semiconductor substrate having different crystal orientations;

forming a dummy gate structure on the semiconductor layer;

forming a source region and a drain region in the semiconductor substrate and the semiconductor layer and at opposite sides of the dummy gate structure;

forming an interlayer dielectric layer on the semiconductor layer, the interlayer dielectric layer being substantially flush with the dummy gate structure;

removing the dummy gate structure and the semiconductor layer beneath the dummy gate structure, forming an opening in the interlayer dielectric layer and the semiconductor layer, the semiconductor substrate being exposed at a bottom of the opening; and forming a metal gate structure in the opening.

Optionally, the transistor is an NMOS transistor, the semiconductor substrate having crystal orientation (100), and the semiconductor layer having crystal orientation (110).

Optionally, the transistor is a PMOS transistor, the semiconductor substrate having crystal orientation (110), and the semiconductor layer having crystal orientation (100).

Optionally, a thickness of the semiconductor layer is ranged from 3 nm to 30 nm.

Optionally, the method further comprises:

forming lightly doped regions in the semiconductor substrate and the semiconductor layer by lightly doped drain implantation, wherein the lightly doped regions are at opposite sides of the gate structure.

Optionally, before forming the metal gate structure in the opening, the method further comprises:

forming an epitaxial layer in the opening, wherein the epitaxial layer is formed between the metal gate structure and the semiconductor substrate, wherein the epitaxial layer and the semiconductor substrate have the same crystal orientation.

Optionally, the epitaxial layer is made of silicon germanium, wherein the mass concentration of germanium in the silicon germanium is ranged from 4% to 40%.

Optionally, the method further comprises:

implanting defect absorbing ions into the epitaxial layer to form defect absorbing ions in the epitaxial layer, wherein the defect absorbing ions are used to absorb the defects in a channel region.

Optionally, the defect absorbing ions are fluoride ions or nitrogen ions.

Optionally, a method for removing the semiconductor layer is wet etching.

Optionally, the wet etching uses alkaline solution.

Accordingly, the present invention also provides a transistor, which comprises:

a semiconductor substrate, a semiconductor layer formed thereon, the semiconductor layer and the semiconductor substrate having different crystal orientations;

an interlayer dielectric layer formed on the semiconductor layer;

an opening formed in the interlayer dielectric layer and the semiconductor layer, the semiconductor substrate exposed at a bottom of the opening;

a metal gate structure formed in the opening;

a source region formed in the semiconductor layer and the semiconductor substrate; and a drain region formed in the semiconductor layer and the semiconductor substrate, the source region and the drain region being respectively at opposite sides of the metal gate structure.

Optionally, the transistor is an NMOS transistor, the semiconductor substrate having crystal orientation (100) and the semiconductor layer having crystal orientation (110).

Optionally, the transistor is a PMOS transistor, the semiconductor substrate having crystal orientation (110) and the semiconductor layer having crystal orientation (100).

Optionally, a thickness of the semiconductor layer is ranged from 3 to 30 nm.

Optionally, the transistor further comprises:

lightly doped regions in the semiconductor layer and the semiconductor substrate, and at opposite sides of the metal gate structure.

Optionally, the transistor further comprises:

an epitaxial layer between the metal gate structure and the semiconductor layer, and between the source region and the drain region, the epitaxial layer and the semiconductor substrate having the same crystal orientation, and the epitaxial layer being substantially flush with the semiconductor layer.

Optionally, the epitaxial layer is made of silicon germanium, wherein the mass concentration of germanium in the silicon germanium is ranged from 4% to 40%.

Optionally, defect absorbing ions formed in the epitaxial layer, wherein the defect absorbing ions are used for absorbing the defects in a channel region.

Optionally, the defect absorbing ions are fluoride ions or nitrogen ions.

Compared with prior arts, technical solutions provided by the invention have advantages below.

The present invention firstly forms a semiconductor layer on a semiconductor substrate, wherein the semiconductor layer and the semiconductor substrate have different crystal orientation. Then a source region and a drain region are formed in the semiconductor layer and the semiconductor substrate, and at the opposite sides of the dummy gate structure. For the source region and the drain region are formed in the semiconductor layer and the semiconductor substrate, the semiconductor layer and the semiconductor substrate between the source region and the drain region form a channel region, and the crystal orientation of the semiconductor layer and the semiconductor substrate are different, therefore a stress is formed in the channel region by the semiconductor layer and the semiconductor substrate. The stress increases the carrier mobility of the source region and the drain region, and a saturation leakage current of the transistor is increased and a device performance is promoted.

Optionally, before forming the metal gate structure in the opening, the method further comprises: forming an epitaxial layer in the opening, thus the epitaxial layer has the same crystal orientation with the semiconductor substrate. Using the epitaxial layer to form a part of the channel region instead of the semiconductor layer can reduce the leakage current in the channel region caused by the crystal orientation differences between the semiconductor layer and the semiconductor substrate, and also can stop a drop of the carrier mobility caused by the crystal orientation difference between the epitaxial layer and the semiconductor substrate.

Optionally, the method further comprises: implanting defect absorbing ions into the epitaxial layer, forming defect absorbing ions in the epitaxial layer. The defect absorbing ions are used for absorbing the defects in the channel region. Therefore oxidation enhance diffusion effects caused by the defects in the channel region are prevented and the device leakage current is reduced.

DETAILED DESCRIPTION OF THE EMBODIMENTS

A transistor fabricated by a conventional method has too low saturation current, which may impact device performance. It is found after detailed analysis and research that low carrier mobility may result in low saturation current. When the critical dimension of the transistor decreases, for example to 45 nm or so, the thickness of the gate dielectric layer thereof decreases, and the distance between the source region and the drain region is shortened, resulting in serious current leakage of the transistor.

Figure 4:
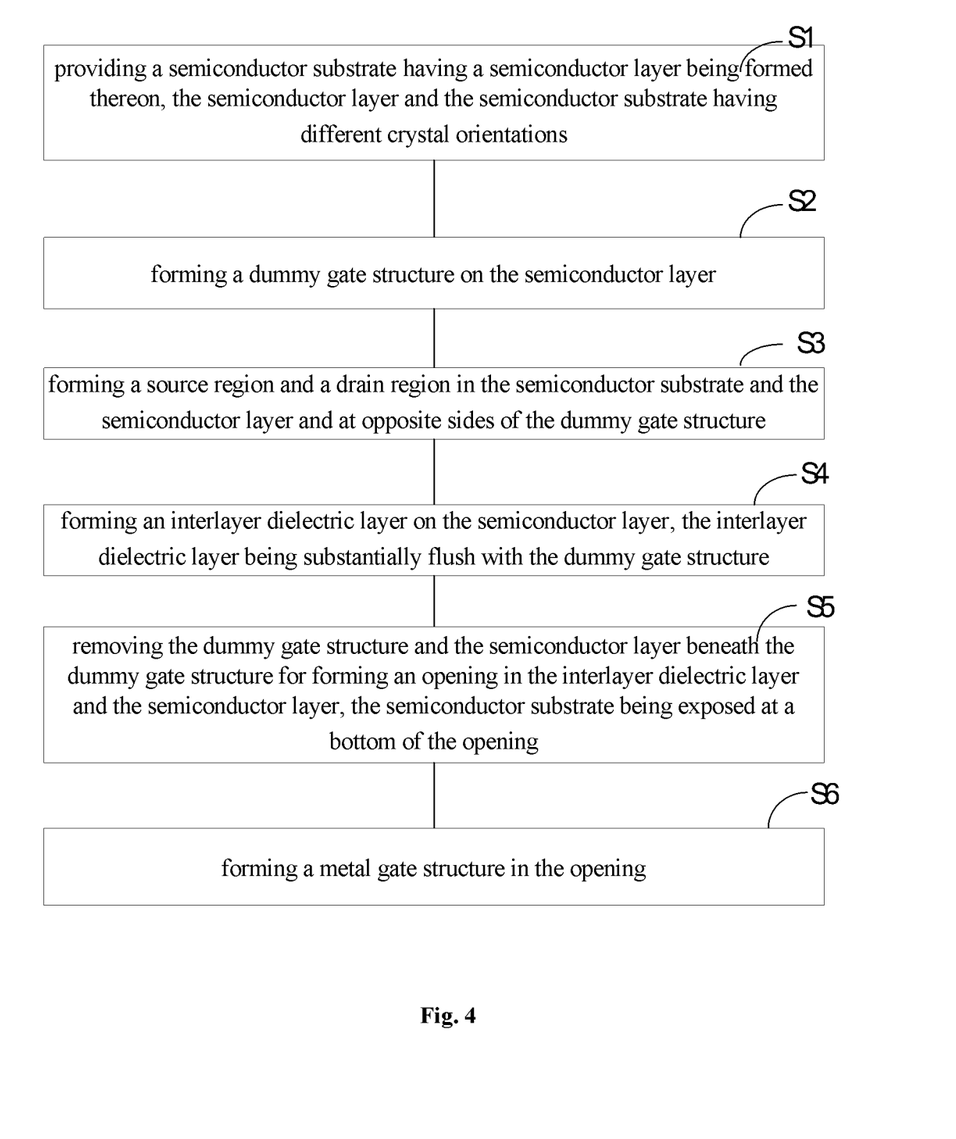
FIG. 4 is a flow chart of a method for forming a transistor according to an embodiment of the present invention.

After creative work, a method for forming a transistor is proposed. As shown in FIG. 4, the method comprises:

S1: providing a semiconductor substrate, a semiconductor layer being formed thereon, the semiconductor layer and the semiconductor substrate having different crystal orientations;

S2: forming a dummy gate structure on the semiconductor layer;

S3: forming a source region and a drain region in the semiconductor substrate and the semiconductor layer, and at opposite sides of the dummy gate structure;

S4: forming an interlayer dielectric layer on the semiconductor layer, the interlayer dielectric layer being substantially flush with the dummy gate structure;

S5: removing the dummy gate structure and the semiconductor layer beneath the dummy gate structure for forming an opening in the interlayer dielectric layer and the semiconductor layer, the semiconductor substrate being exposed at a bottom of the opening; and S6: forming a metal gate structure in the opening.

In order to clarify the objects, characteristics and advantages of the invention, embodiments of the invention will be interpreted in detail in combination with accompanied drawings. More examples are provided hereinafter to describe the invention. However, it shall be appreciated by those skilled in the art that alternative ways may be made without deviation from the scope of the invention. Therefore the invention is not limited within the embodiments described here.

FIGS. 5-11 illustrate a method for forming a transistor according to an embodiment of the present invention.

Figure 5:
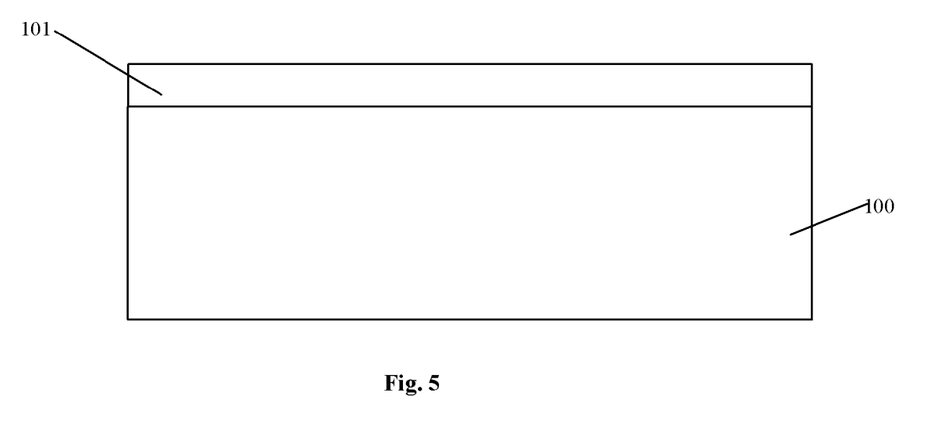
FIGS. 5-11 are cross-sectional views of intermediate structures of a transistor, illustrating a method for forming a transistor according to an embodiment of the present invention.

Referring to FIG. 5, a semiconductor substrate 100 is provided. A semiconductor layer 101 is formed on the semiconductor substrate 100. The semiconductor layer 101 and the semiconductor substrate 100 have different crystal orientations.

As a result of the crystal orientation difference, stress is produced between the semiconductor layer 101 and the semiconductor substrate 100. The type of the stress may vary depending on the crystal orientations of the semiconductor layer 101 and the semiconductor substrate 100.

Specifically, if the semiconductor substrate 100 has crystal orientation (100), and the semiconductor layer 101 has crystal orientation (110), tensile stress is produced between the semiconductor substrate 100 and the semiconductor layer 101, which can raise mobility of electrons and thus is beneficial for increasing saturation current of an NMOS transistor. Alternatively, if the semiconductor substrate 100 has crystal orientation (110), and the semiconductor layer 101 has crystal orientation (100), compressive stress is produced between the semiconductor substrate 100 and the semiconductor layer 101, which can raise mobility of holes and thereby promoting saturation current of a PMOS transistor.

The semiconductor layer 101 needs a certain thickness to provide adequate stress. That means the thickness needs to be larger than 3 nm. However, the thickness of the semiconductor layer 101 may not be too large for avoiding that the transistor does not meet requirements. The thickness of the semiconductor layer 101 should be less than 32 nm. Therefore, sufficient stress is produced for effectively raising mobility of carriers without impacting the performance of the transistor.

Figure 6:
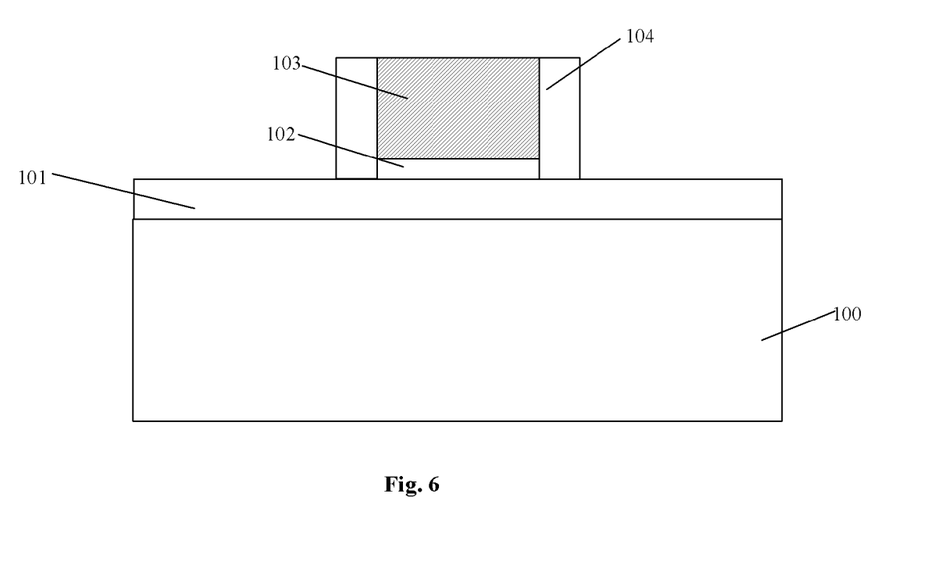

Then, referring to FIG. 6, a gate dielectric layer 102 is formed on the semiconductor layer 101, and a dummy gate electrode 103 is formed on the gate dielectric layer 102. The dummy gate electrode 103 and the gate dielectric layer 102 constitute a dummy gate structure.

The gate dielectric layer 102 is made of electrical isolation material. Optionally, the electrical isolation material is silicon oxide or silicon nitride oxide. The gate dielectric layer 102 has a thickness ranged from 3 angstroms to 80 angstroms. The gate dielectric layer 102 is formed by an oxidation process.

The dummy gate electrode 103 is made of polycrystalline silicon, which is formed by a chemical vapor deposition process. The chemical vapor deposition process is well known in the art.

In one embodiment of the present invention, after forming the dummy gate electrode 103, dummy gate electrode spacers 104 are formed to protect the dummy gate electrode 103 and the gate dielectric layer 102 at the opposite sides of the dummy gate electrode 103 and the gate dielectric layer 102 and on the semiconductor layer 101. The dummy gate electrode spacers 104 can be a single layer of silicon oxide or multi layers of an ONO structure including silicon oxide layer-silicon nitride layer-silicon oxide layer.

Figure 7:
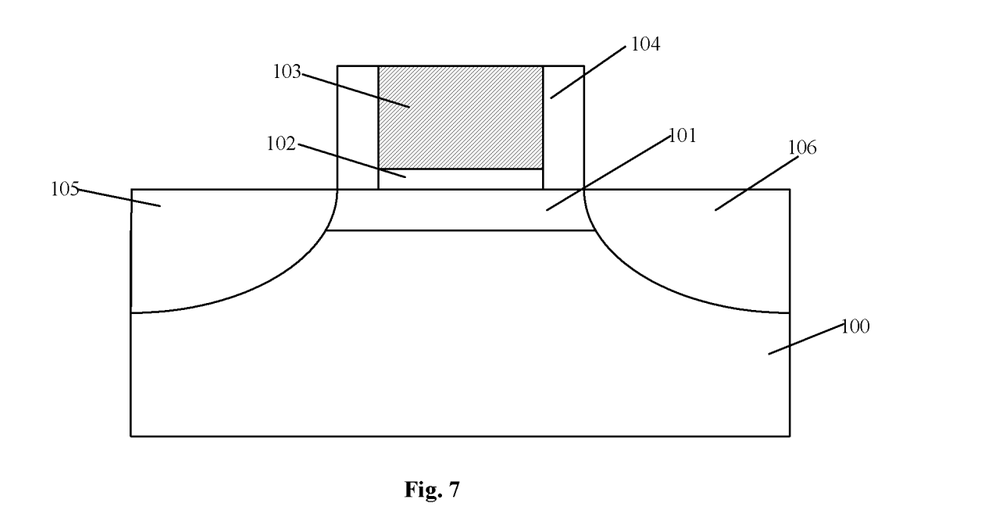

Then, referring to FIG. 7, a source region 105 and a drain region 106 are formed in the semiconductor substrate 100 and the semiconductor layer 101 at the opposite sides of the dummy gate electrode 103 and the gate dielectric layer 102.

The source region 105 and the drain region 106 are formed by source/drain implant (SD implant). The SD implant is well known in the art.

The part of the semiconductor layer 101 and the semiconductor substrate 100 between the source region 105 and the drain region 106 forms a channel region. Stress is provided between the semiconductor layer 101 and the source region 105, and between the semiconductor layer 101 and the drain region 106, thereby increasing carrier mobility in the channel region and further promoting saturation current of the transistor.

Figure 8:
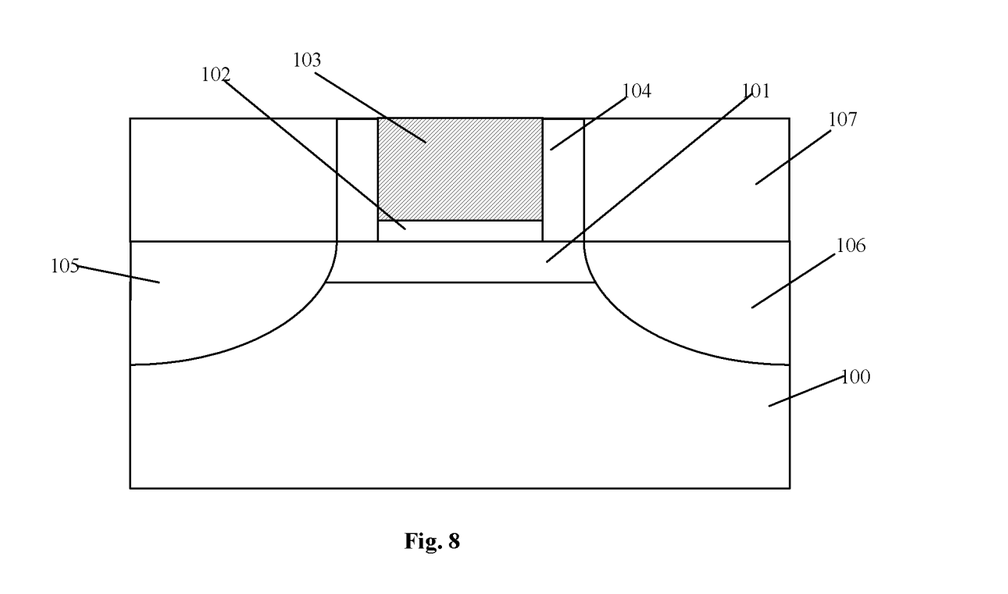

Then, referring to FIG. 8, an interlayer dielectric layer is formed on the semiconductor layer 101 and interlayer dielectric layer is substantially flush with the gate electrode 104. The interlayer dielectric layer 107 can be made of silicon oxide, silicon nitride, silicon carbide or silicon nitride oxide.

Figure 9:
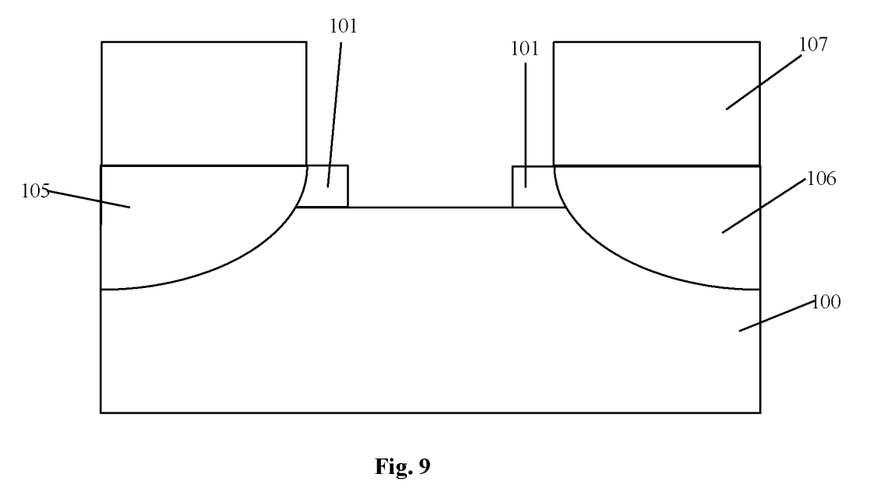

Then, referring to FIG. 9, the part of semiconductor layer 101 beneath the gate dielectric layer 102, the dummy gate electrode 103 (referring to FIG. 8) and the gate dielectric layer 102 (referring to FIG. 8) are removed through an etching process. An opening is formed in the interlayer dielectric layer 107 and the semiconductor layer 101. The semiconductor substrate 100 is exposed on a bottom of the opening. The opening is used for forming a metal gate structure in follow-up process. The width of the removed semiconductor 101 is substantially equal to the width of the dummy gate structure.

The methods for removing the dummy gate structure 103 and the gate dielectric layer 102 can be wet etching or dry etching. Fluoride ions and fluoride plasma can be used to etch in the dry etching, and acid solution can be used in the wet etching. The acid solution can be solution mixed by hydrochloric acid, ethylic acid and nitric acid. The method for removing the semiconductor layer 101 is wet etching. Alkaline solution is used in the wet etching, which can be KOH solution or ammonium hydroxide solution.

Damages may be formed in the dummy gate electrode spacers 104 at the opposite sides of the dummy gate electrode 103 and the gate dielectric layer 102 by the etching process, thus leakage current of the metal gate structure formed in the follow-up process may be aroused. Therefore, in an optional embodiment of the present invention, the etching process is further needed to remove the dummy gate electrode spacers 104 (referring to FIG. 8) at the opposite sides of the dummy gate structure 103 and the gate dielectric layer 102, in order that the part of semiconductor layer 101 beneath the dummy gate electrode spacers 104 is exposed.

Figure 10:
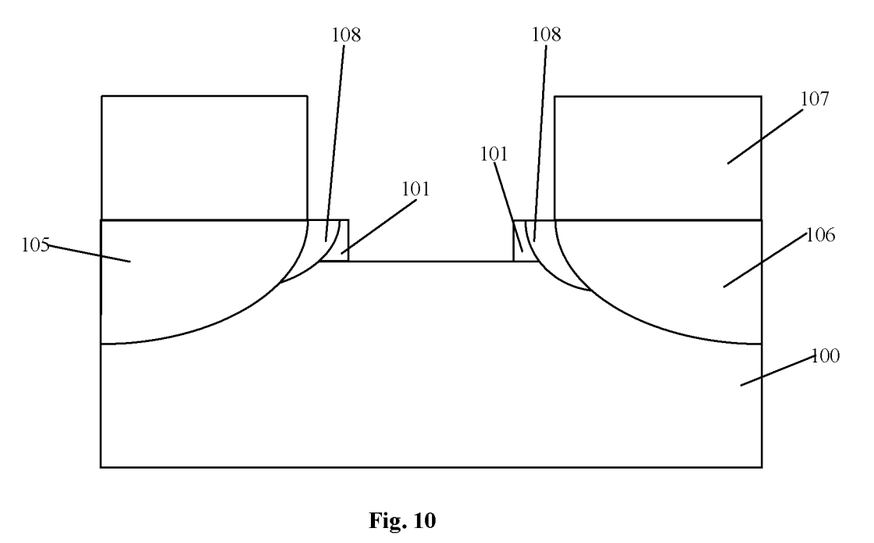

Then referring to FIG. 10, lightly doped drain (LDD) implantation is proceeded to form lightly doped regions 108 in the semiconductor layer 101 and the semiconductor substrate 100. The LDD implantation has a tilted angle to control the width of the lightly doped regions 108, and to prevent the LDD from being implanted into the semiconductor substrate 100 at the bottom of the opening. As an embodiment of the present invention, the implantation angle of the LDD implant is ranged from 20° to 45°.

Figure 11:
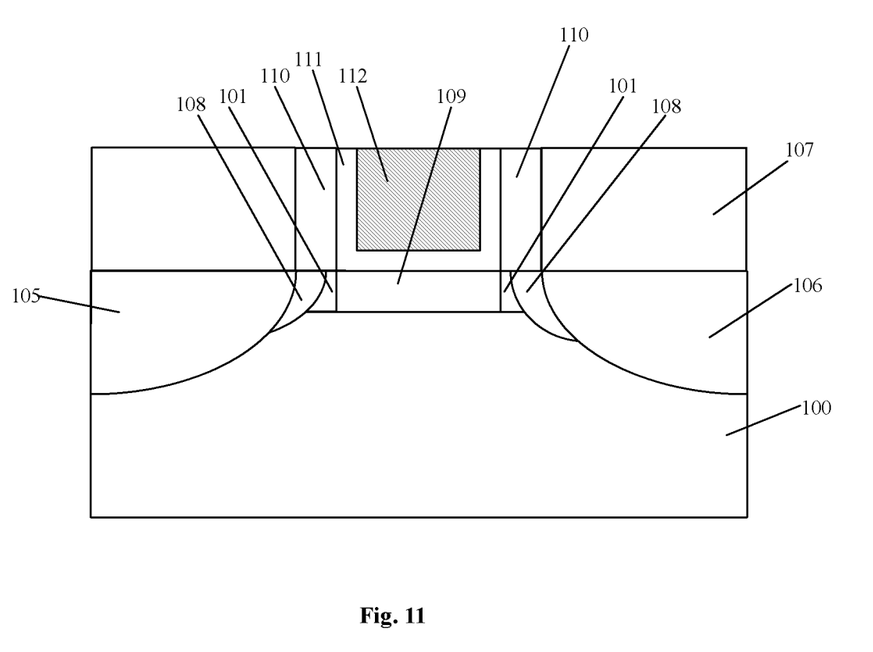

Then, referring to FIG. 11, in one embodiment of the present invention, epitaxial process is performed to form an epitaxial layer 109 in the semiconductor layer 101 after the lightly doped regions 108 are formed. The epitaxial layer 109 has the same crystal orientation with the semiconductor substrate 100. A location of the epitaxial layer 109 is corresponding with a location of the metal gate structure formed in the follow-up process. The epitaxial layer 109 is located in the semiconductor layer 101 between the source region 105 and the drain region 106, and is substantially flush with the semiconductor layer 101. For the crystal orientations of the epitaxial layer 109 and the semiconductor substrate 100 is the same, using the epitaxial layer 109 as a part of the channel region can reduce the leakage current in the channel region caused by the crystal orientation difference between the semiconductor layer and the semiconductor substrate.

The epitaxial layer 109 is made of semiconductor materials. In an embodiment of the present invention, the epitaxial layer 109 is made of silicon germanium and the mass concentration of germanium in the silicon germanium is ranged from 4% to 40%.

After the epitaxial layer 109 is formed, defect absorbing ions are implanted into the epitaxial layer 109. The defect absorbing ions are used for absorbing the defects in the channel region. In the embodiment herein, the defect absorbing ions are fluoride ions and nitrogen ions. The defect absorbing ions are used for absorbing the defects in the channel region to prevent oxidation enhance diffusion effects caused by the defects in the channel region and to reduce the leakage current of the device.

Then, referring to FIG. 11, metal gate electrode spacers 110 are formed on side walls of the opening in the interlayer dielectric layer 107. The metal gate electrode spacers 110 are made of silicon oxide, silicon nitride, silicon carbide or silicon nitride oxide. A thickness of the metal gate electrode spacers 110 should be less than 20 nm to minish the area of the transistor.

Then, a high K dielectric layer 111 is formed at the bottom and on the side walls of the opening in the interlayer dielectric layer 107. The high K dielectric layer 111 may be made of hafnium oxide, silicon hafnium oxide, lanthanum oxide, zirconium oxide, silicon zirconium oxide, titanium oxide, tantalum oxide, titanium strontium barium oxide, titanium barium oxide, aluminum oxide. The high K dielectric layer 111 located at the bottom of the opening covers the surface of the epitaxial layer 109.

Compared with the high K dielectric layer formed only at the bottom of the opening in prior arts, the high K dielectric layer in the present invention is formed at the bottom and on the side walls of the opening, thereby the present invention reduces the leakage current of the transistor.

Then, referring to FIG. 11, a metal gate electrode 112 is formed in the opening and is substantially flush with the interlayer dielectric layer 107, the metal gate electrode spacers 110 and the high K dielectric layer 111. The metal gate electrode 112 and the high K dielectric layer 111 constitute a metal gate structure which is on a top of the epitaxial layer 109.

Referring to FIG. 11, a transistor formed according to the embodiments above, which comprises:

a semiconductor substrate 100 having a semiconductor layer 101 formed thereon, and the semiconductor layer 101 and the semiconductor substrate 100 having different crystal orientations;

an interlayer dielectric layer 107 formed on the semiconductor layer 101;

an opening located in the interlayer dielectric layer 107 and the semiconductor layer 101, the semiconductor substrate 100 being exposed at a bottom of the opening;

a metal gate structure formed in the opening, wherein the metal gate structure comprises a high K dielectric layer 111 and a metal gate electrode 112, the high K dielectric layer 111 is formed at a bottom and on side walls of the opening and the metal gate electrode 112 fills the opening completely;

metal gate electrode spacers 110 formed on sidewalls of the opening, and between the metal gate structure and the interlayer dielectric layer 107;

a source region 105 formed in the semiconductor layer 101 and the substrate 100; and a drain region 106 formed in the semiconductor layer 101 and the substrate 100, the source region 105 and the drain region 106 being respectively at opposite sides of the metal gate structure.

In an embodiment of the present invention, the transistor further comprises:

an epitaxial layer 109 located between the metal gate structure and the semiconductor substrate 100, and corresponding with locations of the source region 105 and the drain region 106, wherein the epitaxial layer 109 and the semiconductor substrate 100 have different crystal orientations and the epitaxial layer 109 is used for filling the opening completely in the semiconductor layer 101;

lightly doped regions 108 located in the semiconductor substrate 100 and the semiconductor layer 101, and at opposite sides of the metal gate structure.

The epitaxial layer 109, as a channel region of the transistor, has a different crystal orientation from the semiconductor substrate 100, thus the epitaxial layer 109 can reduce the leakage current of the transistor and prevent the drop of the carrier mobility caused by the crystal orientation difference between the channel region and the semiconductor substrate 100. The epitaxial layer 109 is made of silicon germanium and the mass concentration of germanium in the silicon germanium is ranged from 4% to 40%. The epitaxial layer 109 has defect absorbing ions which are used for absorbing defects in the channel region. Doped ions in the defect absorption region are fluoride ions or nitrogen ions.

It should be noted that the crystal orientations of the semiconductor layer 100 and the semiconductor substrate 100 need to be set according to the type of the transistor. When the transistor is NMOS transistor, the semiconductor substrate 100 has crystal orientation (100) and the semiconductor layer 101 has crystal orientation (110). Tensile stress is formed between the semiconductor substrate 100 and the semiconductor layer 101, thus is beneficial to increase the electrons mobility and to enlarge the saturation current of the NMOS transistor. When the transistor is PMOS transistor, the semiconductor substrate 100 has crystal orientation (110) and the semiconductor layer 101 has crystal orientation (100), thus is beneficial to increase the holes mobility and to enlarge the saturation current of the PMOS transistor.

A certain thickness of the semiconductor layer 101 is needed to create adequate stress. The thickness of the semiconductor layer 101 needs to be lager than 3 nm. However, the thickness of the semiconductor layer 101 shouldn't be too large, avoiding failing to form the required transistor. The thickness of the semiconductor layer 101 needs to be smaller than 32 nm. Adequate stress is able to be formed to effectively increase the carrier mobility and in the meantime the performance of the transistor won't be affected within the thickness range mentioned above. In an embodiment of the present invention, the thickness of the semiconductor layer 101 is ranged from 3 nm to 30 nm.

Summing up the above, the present invention provides a transistor and a method for forming the same. The method includes: forming a semiconductor layer on a semiconductor substrate, therein the crystal orientation of the semiconductor layer is different from the crystal orientation of the semiconductor substrate; forming a dummy gate structure on the semiconductor layer; forming a source region and a drain region in the semiconductor substrate and the semiconductor layer at opposite sides of the dummy gate structure. As the source region and the drain region are formed in the semiconductor substrate and the semiconductor layer, the semiconductor substrate and the semiconductor layer between the source region and the drain region constitute a channel region, and because of the crystal orientation difference between the semiconductor substrate and the semiconductor layer, stress is formed in the channel region by the semiconductor substrate and the semiconductor layer. The stress increases carrier mobility of the source region and the drain region, thus increases saturation leakage current of the transistor and promotes the semiconductor device performance.

In an embodiment of the present invention, before the forming of the metal gate structure in the opening, the method further includes: forming an epitaxial layer in the opening, thereby the formed epitaxial layer and the semiconductor substrate having different crystal orientations. Using the epitaxial layer as a part of the channel region instead of the semiconductor layer can reduce the leakage current in the channel region caused by the crystal orientation difference between the semiconductor layer and the semiconductor substrate, and also can prevent the drop of carrier mobility caused by the crystal orientation difference between the epitaxial layer and the semiconductor substrate.

In an embodiment of the present invention, the method further includes: implanting defect absorbing ions into the epitaxial layer to form defect absorbing ions in the epitaxial layer. The defect absorbing ions are used for absorbing the defects in the channel region to prevent oxidation enhance diffusion effects caused by the defects in the channel region and to reduce the leakage current of the device.

The invention is disclosed, but not limited, by preferred embodiment as above. Based on the disclosure of the invention, those skilled in the art shall make any variation and modification without deviation from the scope of the invention.

Therefore, any simple modification, variation and polishing based on the embodiments described herein belongs to the scope of the invention.

What is claimed is:

1. A transistor, comprising:
   a semiconductor substrate having a semiconductor layer formed thereon, the semiconductor layer and the semiconductor substrate having different crystal orientations;
   an interlayer dielectric layer formed on the semiconductor layer;
   an opening formed through the interlayer dielectric layer and through the semiconductor layer having a portion of the semiconductor layer in the opening, the semiconductor substrate being exposed at a bottom of the opening;
   a metal gate structure formed in the opening;
   a source region formed in the semiconductor layer and the semiconductor substrate; and
   a drain region formed in the semiconductor layer and the semiconductor substrate, the source region and the drain region being respectively at opposite sides of the metal gate structure, wherein the portion of the semiconductor layer in the opening is between the source region and the drain region, and has the different crystal orientation than the underlying semiconductor substrate.

2. The transistor according to claim 1, wherein the transistor is an NMOS transistor, the semiconductor substrate has crystal orientation (100), and the semiconductor layer has crystal orientation (110).

3. The transistor according to claim 1, wherein the transistor is a PMOS transistor, the semiconductor substrate has crystal orientation (110), and the semiconductor layer has crystal orientation (100).

4. The transistor according to claim 1, wherein the semiconductor layer has thickness in a range of 3 nm to 30 nm.

5. The transistor according to claim 1, further comprising:
   lightly doped regions formed in the semiconductor substrate and the portion of the semiconductor layer in the opening, and at the opposite sides of the metal gate structure between the source region and the drain region.

6. The transistor according to claim 5, further comprising:
   an epitaxial layer formed between the metal gate structure and the semiconductor substrate exposed at the bottom of the opening, and between the source region and the drain region, the epitaxial layer having a same crystal orientation with the underlying semiconductor substrate exposed at the bottom of the opening and being flush with the portion of the semiconductor layer in the opening.

7. The transistor according to claim 6, wherein the epitaxial layer is made of silicon germanium, and mass concentration of the germanium in the silicon germanium is ranged from 4% to 40%.

8. The transistor according to claim 6, wherein the epitaxial layer has defect absorbing ions which are used for absorbing defects in a channel region.

9. The transistor according to claim 8, wherein the defect absorbing ions are fluoride ions or nitrogen ions.

* * * * *